(12) United States Patent
Tsai et al.

(10) Patent No.: US 11,114,981 B2
(45) Date of Patent: Sep. 7, 2021

(54) DIFFERENTIAL AMPLIFIER

(71) Applicant: REALTEK SEMICONDUCTOR CORPORATION, Hsinchu (TW)

(72) Inventors: Tzung-Ling Tsai, New Taipei (TW); Shu-Lin Chang, Hsinchu (TW); Chih-Lung Chen, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/733,269

(22) Filed: Jan. 3, 2020

(65) Prior Publication Data
US 2020/0328719 A1  Oct. 15, 2020

(30) Foreign Application Priority Data
Apr. 11, 2019  (TW) .................... 108112747

(51) Int. Cl.
*H03F 3/45* (2006.01)
*H03F 1/02* (2006.01)

(52) U.S. Cl.
CPC ....... *H03F 1/0211* (2013.01); *H03F 3/45071* (2013.01)

(58) Field of Classification Search
CPC ....................................................... H03F 3/45
USPC .................... 330/253, 258, 259, 260, 261
See application file for complete search history.

(56) References Cited

U.S. PATENT DOCUMENTS

| | | | | |
|---|---|---|---|---|
| 7,129,782 B2* | 10/2006 | Lebedev | ............. | H03F 1/305 330/258 |
| 8,339,200 B2* | 12/2012 | Wong | ............. | H03F 3/45188 330/253 |
| 8,698,559 B2* | 4/2014 | Kasanyal | ............. | H03F 3/45632 330/253 |
| 9,344,048 B1 | 5/2016 | Liu et al. | | |

OTHER PUBLICATIONS

Design of Analog CMOS Integrated Circuits/ Behzad Razavi / p. 319, 2001, McGraw-Hill International Edition.

* cited by examiner

*Primary Examiner* — Henry Choe
(74) *Attorney, Agent, or Firm* — WPAT, PC

(57) ABSTRACT

Disclosed is a differential amplifier including an input circuit, a detecting and controlling circuit, and an output circuit. The input circuit outputs input current to two output nodes according to the voltage of a differential input signal and the voltage of a bias node. The detecting and controlling circuit outputs compensative current to the two output nodes according to control bias voltage and the voltage of the bias node, in which the voltage of the bias node and the compensative current relate to the voltage of the differential input signal. The output circuit is coupled to the two output nodes and outputs a differential output signal according to the sum of the input current and the compensative current. Due to the detecting and controlling circuit outputting the compensative current, the differential amplifier prevents itself from entering a deadlock state even though the input current is insufficient or zero.

20 Claims, 13 Drawing Sheets

DIFFERENTIAL AMPLIFIER

BACKGROUND OF THE INVENTION

1. Field of the Invention

The present disclosure relates to an amplifier, especially to a differential amplifier.

2. Description of Related Art

Regarding a conventional amplifier with a differential input and a differential output (i.e., differential amplifier), in a circumstance the input voltage for the differential amplifier goes beyond an operable region, the MOS transistors of the input stage of the differential amplifier will enter a cut-off region, and this will lead to an erroneous bias condition for the differential-mode loop and common-mode loop of the differential amplifier. In another circumstance the input voltage of the differential amplifier resumes normal, the differential amplifier will require additional time for loop adjustment, and this will lead to undesired transient voltage variation during the additional time. Besides, the aforementioned erroneous bias condition may cause the loops to be deadlocked and make the differential amplifier unable to work normally; for instance, in a circumstance the voltage levels at the input terminals of the two transistors of the differential amplifier's input stage are high and the common-mode feedback voltage level is low, the voltage state at the output node of the first stage of the differential amplifier is undefined, and this leads to the malfunction of the common-mode loop and to the deadlock of the loop. In view of the above, what is to be desired is a technical solution as an improvement over the conventional differential amplifier.

SUMMARY OF THE INVENTION

An object of the present disclosure is to disclose a differential amplifier as an improvement over the prior art.

An embodiment of the differential amplifier of the present disclosure includes an input circuit, a detecting and controlling circuit, and an output circuit. The input circuit is configured to output input current to two output nodes according to the voltage of a differential input signal and the voltage of a bias node. The detecting and controlling circuit is configured to output compensative current to the two output nodes according to control bias voltage and the voltage of the bias node, wherein the voltage of the bias node and the compensative current correlate with the voltage of the differential input signal. The output circuit is coupled to the two output nodes and configured to output a differential output signal according to the sum of the input current and the compensative current. Because the detecting and controlling circuit outputs the compensative current, the differential amplifier can prevent itself from malfunction even though the input current is insufficient or zero.

Another embodiment of the differential amplifier of the present disclosure includes a biasing circuit, an input circuit, a detecting and controlling circuit, and an output circuit. The biasing circuit is configured to supply input bias current to the input circuit and the detecting and controlling circuit. The input circuit is configured to output input current to two output nodes according to the voltage of a differential input signal, wherein the input current is originated from the input bias current. The detecting and controlling circuit is configured to output compensative current to the two output nodes according to the voltage of the differential input signal, wherein the compensative current is originated from the input bias current. The output circuit is coupled to the two output nodes and configured to output a differential output signal according to the sum of the input current and the compensative current. By reason of the detecting and controlling circuit outputting the compensative current, the differential amplifier can prevent itself from malfunction even though the input current is insufficient or zero.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure discloses a differential amplifier operable to generate compensative current for the differential amplifier itself to prevent malfunction even though the input current for the differential amplifier is insufficient or zero.

Figure 1:
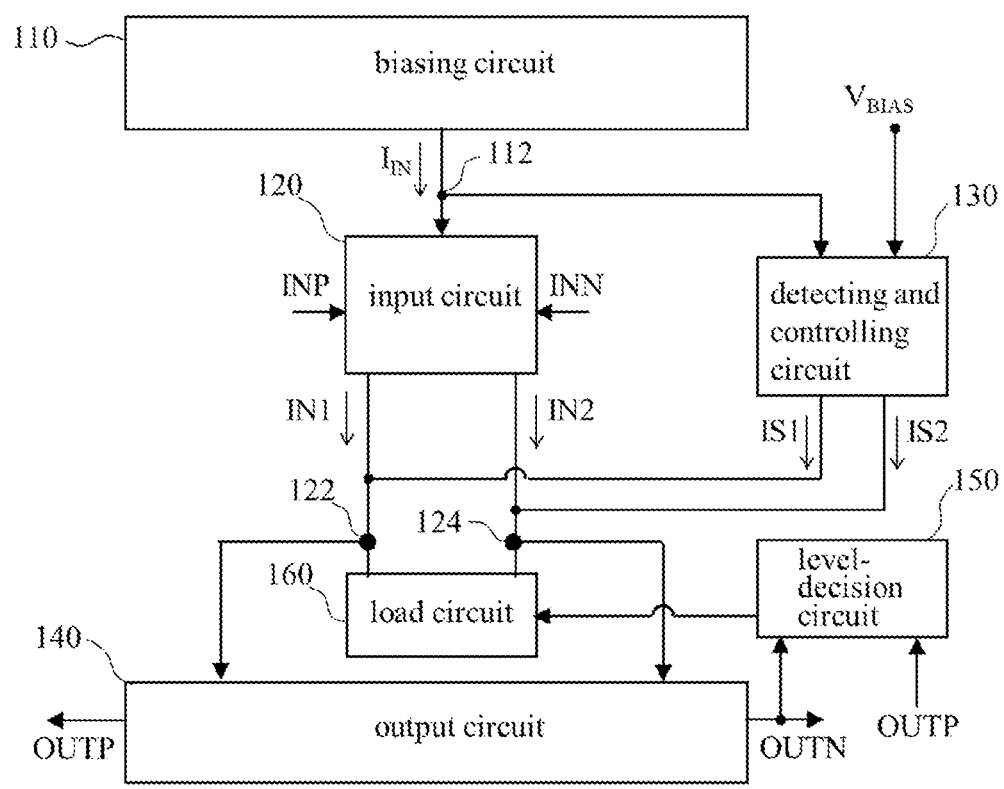
FIG. 1 shows an embodiment of the differential amplifier of the present disclosure.

FIG. 1 shows an embodiment of the differential amplifier of the present disclosure. The differential amplifier 100 includes a biasing circuit 110, an input circuit 120, a detecting and controlling circuit 130, an output circuit 140, a level-decision circuit 150, and a load circuit 160. These circuits are described in detail below.

Figure 2:
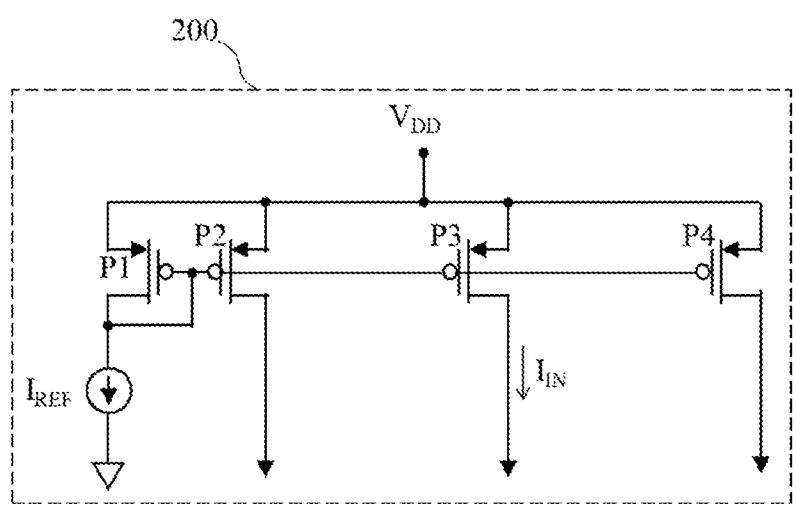
FIG. 2 shows an embodiment of the biasing circuit of FIG. 1.

Please refer to FIG. 1. The biasing circuit 110 is configured to supply a predetermined input bias current ($I_{IN}$) to the input circuit 120 and to the detecting and controlling circuit 130 via a bias node 112. FIG. 2 shows an embodiment of the biasing circuit 110 including a current-mirror circuit 200, in which $V_{DD}$ denotes power supply voltage and $I_{REF}$ denotes reference current. As shown in FIG. 2, the current-mirror circuit 200 supplies the input bias current according to the reference current and a transistor scale (i.e., the scale of the size of transistor P1 to the size of transistor P3). Since the current-mirror circuit 200 of FIG. 2 and the general modifications thereof are well known in this technical field, the detail is omitted here.

Figure 3:
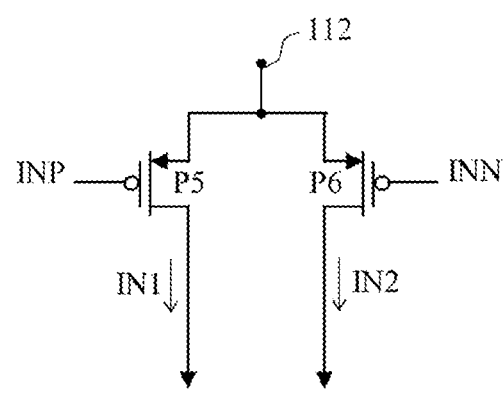
FIG. 3 shows an embodiment of the input circuit of FIG. 1.

Please refer to FIG. 1. The input circuit 120 is configured to output input current (IN1, IN2) to two output nodes 122, 124 according to the voltage of a differential input signal (i.e., the signal INP at the positive input terminal and the signal INN at the negative input terminal) and the voltage of the bias node 112, in which the input current is originated from the aforementioned input bias current. FIG. 3 shows an embodiment of the input circuit 120 including a PMOS transistor pair (P5, P6). The PMOS transistor pair determines its conduction state according to the voltage of the differential input signal and the voltage of the bias node 112 so as to output or stop outputting the input current to the two output nodes 122, 124. Since the PMOS transistor pair of FIG. 3 and the general modifications thereof are well known in this technical field, the detail is omitted here.

Please refer to FIG. 1. The detecting and controlling circuit 130 and the input circuit 120 are connected in parallel between the bias node 112 and the two output nodes 122, 124. The detecting and controlling circuit 130 is configured to output compensative current (IS1, IS2) to the two output nodes 122, 124 according to control bias voltage ($V_{BIAS}$) and the voltage of the bias node 112. In an exemplary implementation, the control bias voltage (e.g., the gate voltage of the PMOS transistors P1, P2, P3, P4 in FIG. 2) comes from the biasing circuit 110 while the voltage of the bias node 112 and the compensative current correlate with the voltage of the differential input signal. For instance, in a circumstance the voltage of the differential input signal goes beyond a normal operable region of the input circuit 120, which means that the voltage of the differential input signal (INP, INN) at the positive and negative input terminals reaches a voltage threshold that is determined by the device characteristics of the input circuit 120 (e.g., the characteristics of the PMOS transistor pair of FIG. 3), the circumstance is called an abnormal circumstance. In the abnormal circumstance the input circuit 120 is gradually turned off or completely turned off so that the input current gradually decreases or is zero while the voltage of the bias node 112 in this circumstance is higher than it would be in a normal circumstance (i.e., a circumstance that the voltage of the differential input signal stays within the normal operable region, or that the voltage of the differential input signal at the positive and negative input terminals does not reach the voltage threshold) and the absolute value of the difference between the control bias voltage and the voltage of the bias node 112 is higher than threshold voltage so that the compensative current outputted by the detecting and controlling circuit 130 increases or is fixed correspondingly. An example of the above-mentioned threshold voltage is the gate-to-source voltage $V_{GS}$ of the PMOS transistors of the detecting and controlling circuit 130 in FIG. 4, wherein the gate voltage in the normal circumstance will be higher than the source voltage to reduce or stop the output of the compensative current.

Figure 4:
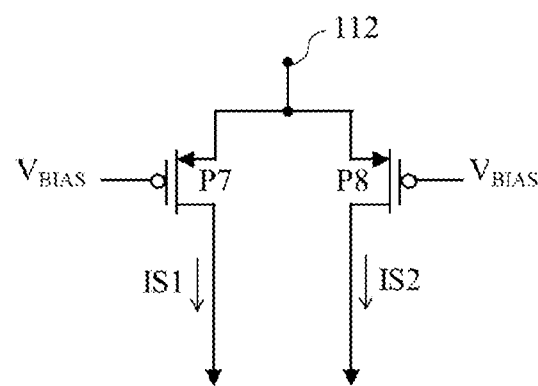
FIG. 4 shows an embodiment of the detecting and controlling circuit of FIG. 1.

FIG. 4 shows an embodiment of the detecting and controlling circuit 130 including a PMOS transistor pair (P7, P8) outputting the compensative current to the two output nodes 122, 124 according to the control bias voltage and the voltage of the bias node 112. In an exemplary implementation, in the aforementioned normal circumstance the PMOS transistor pair does not reach a conduction threshold (i.e., the absolute value of the gate-to-source voltage $|V_{GS}|$ of the PMOS transistors is lower than the threshold voltage $V_{th}$ of the PMOS transistors) and is turned off substantially, and therefore the compensative current is zero or negligible; in the aforementioned abnormal circumstance the PMOS transistor pair reaches the conduction threshold and is turned on, and therefore the compensative current is greater than zero and has substantial influence on the differential output signal. Since the PMOS transistor pair of FIG. 4 and the general modifications thereof are well known in this technical field, the detail is omitted here. It should be noted that both the compensative current and the input current are originated from the aforementioned input bias current; in an exemplary implementation, the input bias current is equal to the sum of the input current and the compensative current ($I_{TOTAL}$=IN1+IN2+IS1+IS2=$I_{IN}$); in another exemplary implementation, the sum of the input current and the compensative current is kept above zero to prevent the differential amplifier 100 from entering a deadlock state or other malfunction states. In addition, those of ordinary skill in the art can appreciate that the aforementioned bias control voltage ($V_{BIAS}$) has no need to be limited to voltage from the biasing circuit 110 or limited to the gate voltage of the current-mirror circuit of the biasing circuit 110; actually, the control bias voltage can be any substantially fixed reference voltage; therefore, people of ordinary skill in the art can choose reference voltage (e.g., voltage generated by a resistor dividing the power supply voltage $V_{DD}$ of the differential amplifier 100) as the bias control voltage for the detecting and controlling circuit 130 to detect the voltage change at the bias node 112 and output the compensative current accordingly.

Figure 5A:
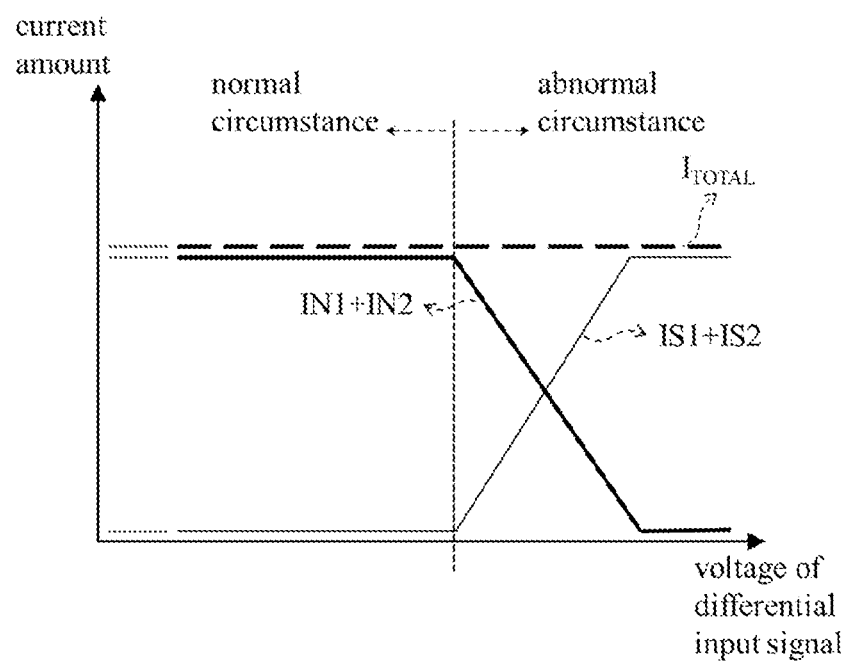
FIG. 5a shows an example of the compensative current and input current of FIG. 1 varying with the voltage of the differential input signal.
Figure 5B:
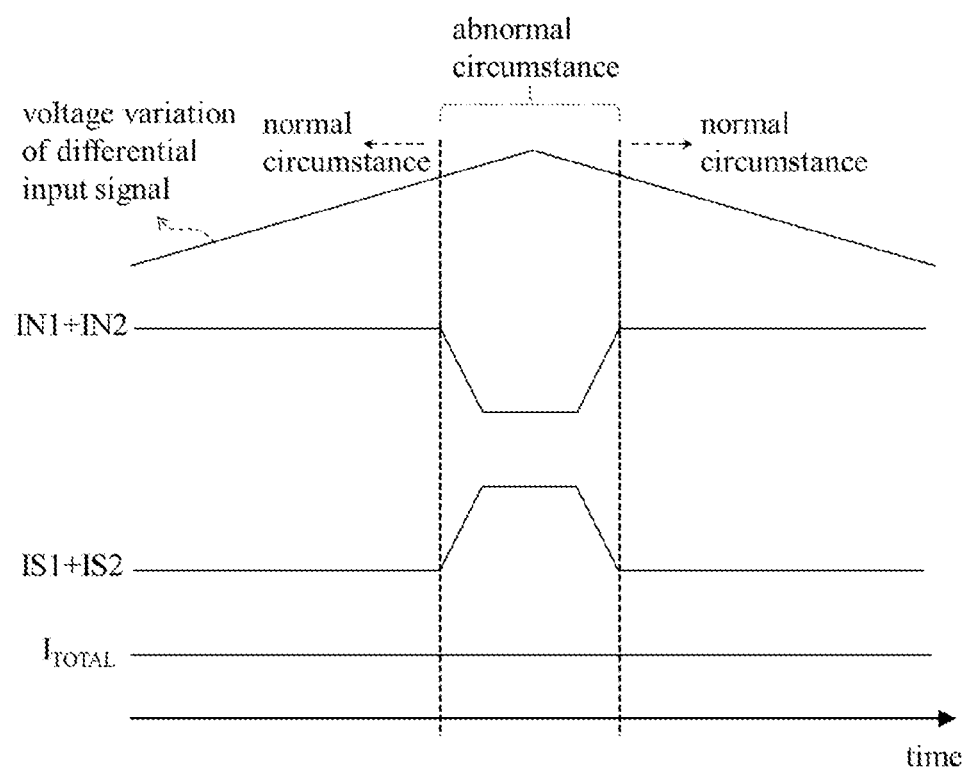
FIG. 5b shows an example of the compensative current and input current of FIG. 1 varying with the voltage of the differential input signal in the time axis.
Figure 6A:
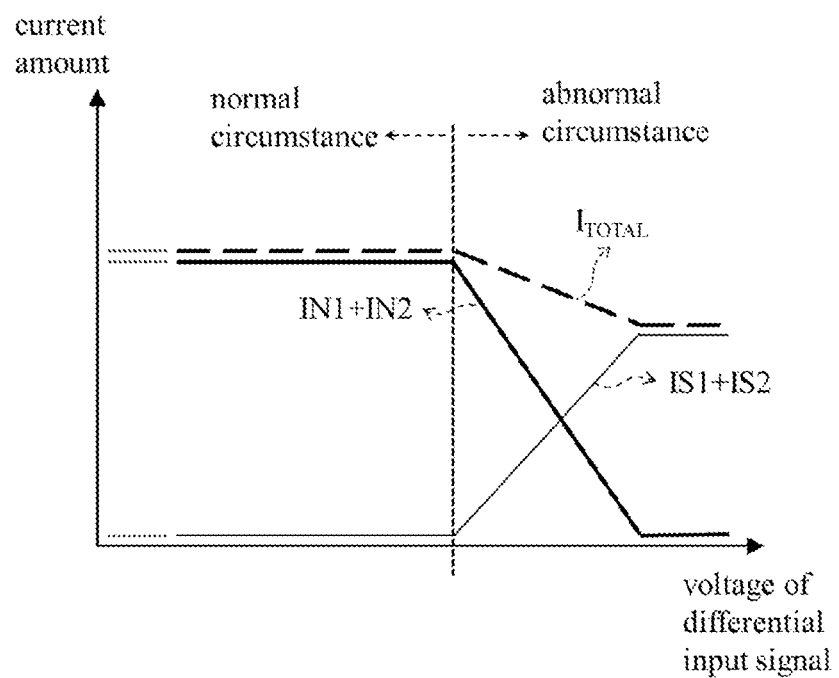
FIG. 6a shows another example of the compensative current and input current of FIG. 1 varying with the voltage variation of the differential input signal.
Figure 6B:
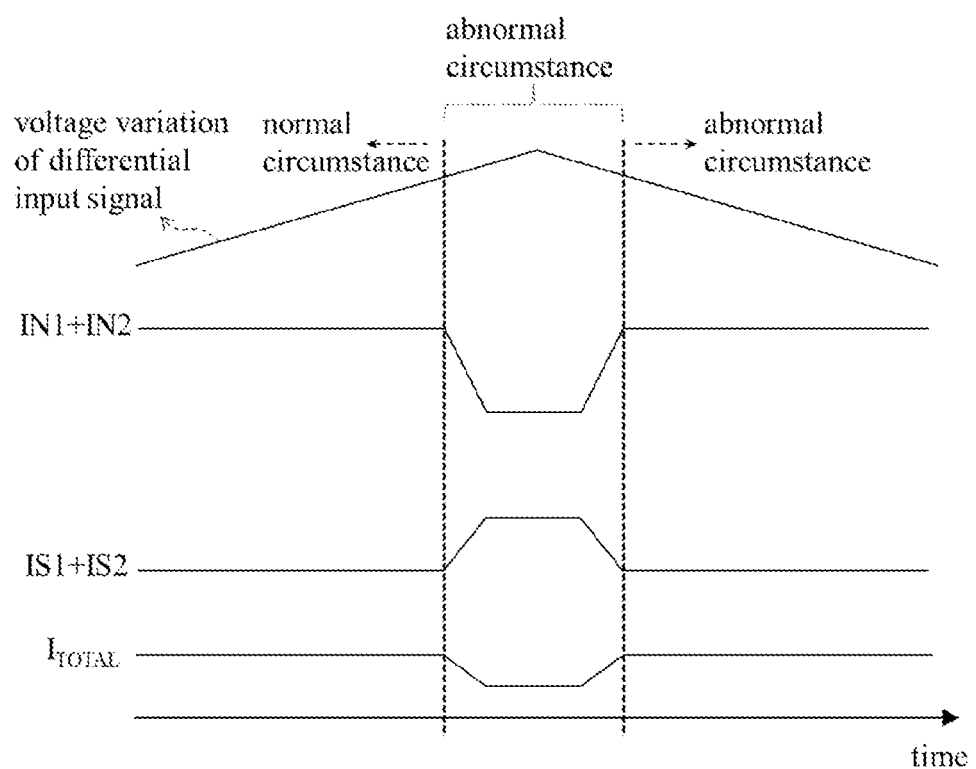
FIG. 6b shows another example of the compensative current and input current of FIG. 1 varying with the voltage variation of the differential input signal in the time axis.

FIGS. 5a-5b shows an exemplary implementation of the compensative current and the input current varying with the voltage of the input differential signal. As shown in FIGS. 5a-5b, the sum $I_{TOTAL}$ of the input current and the compensative current in the normal circumstance is substantially equal to the sum $I_{TOTAL}$ in the abnormal circumstance. In the abnormal circumstance the input current is proportional to the voltage of the differential input signal (e.g., the input current is inversely proportional to the voltage of the differential input signal provided the input circuit 120 is realized with a PMOS transistor pair, and the input current is directly proportional to the voltage of the differential input signal provided the input circuit 120 is realized with an NMOS transistor pair) or the input current is a fixed input current $IN_{MIN1}$ ($IN_{MIN1}$≥0 (e.g., the minimum of the variable input current); and in the abnormal circumstance the compensative current is proportional to the voltage of the differential input signal (e.g., the compensative current is directly proportional to the voltage provided the input circuit 120 is realized with a PMOS transistor pair, and the compensative current is inversely proportional to the voltage provided the input circuit 120 is realized with an NMOS transistor pair) or the compensative current is a fixed compensative current $IS_{MAX1}$ ($IS_{MAX1}$>0) (e.g., the maximum of the variable compensative current). FIG. 6a-6b shows another exemplary implementation of the compensative current and the input current varying with the voltage of the input differential signal. As shown in FIGS. 6a-6b, the sum $I_{TOTAL}$ of the input current and the compensative current in the normal circumstance is greater the sum $I_{TOTAL}$ in the abnormal circumstance; in the abnormal circumstance the input current is proportional to the voltage of the differential input signal (e.g., the input current is inversely proportional to the voltage of the differential input signal provided the input circuit 120 is realized with a PMOS transistor pair, and the input current is directly proportional to the voltage of the differential input signal provided the input circuit 120 is realized with an NMOS transistor pair) or the input current is a fixed input current $IN_{MIN2}$ ($IN_{MIN2} \geq 0$) (e.g., the minimum of the variable input current); and in the abnormal circumstance the compensative current is proportional to the voltage of the differential input signal (e.g., the compensative current is directly proportional to the voltage of the differential input signal provided the input circuit 120 is realized with a PMOS transistor pair, and the compensative current is inversely proportional to the voltage of the differential input signal provided the input circuit 120 is realized with an NMOS transistor pair) or the compensative current is a fixed compensative current $IS_{MAX2} > 0$ ($IS_{MAX2} > 0$) (e.g., the maximum of the variable compensative current).

Figure 7:
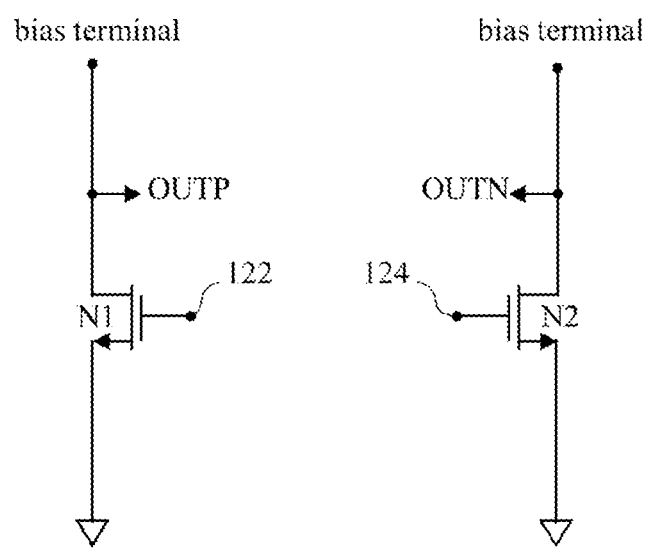
FIG. 7 shows an embodiment of the output circuit of FIG. 1.

Please refer to FIG. 1. The output circuit 140 is coupled to the two output nodes 122, 124 and configured to output a differential output signal (i.e., the signal OUTP of the positive output terminal and the signal OUTN of the negative output terminal) according to the sum of the input current and the compensative current. More specifically, the voltage of the two output nodes correlates with the sum of the input current and the compensative current, and the output circuit 140 determines the differential output signal according to the voltage of the two output nodes. FIG. 7 shows an embodiment of the output circuit 140 including an NMOS transistor pair (N1, N2) coupled to a plurality of bias terminals, wherein the voltage and/or current (e.g., the current outputted by the transistors P2, P4 of FIG. 2) from the bias terminals are determined in accordance with the demand for implementation and the NMOS transistor pair determines the differential output signal according to the voltage of the two output nodes 122, 124 (i.e., the gate voltage of the NMOS transistor pair). Since the NMOS transistor pair of FIG. 7 and the general modifications thereof are well known in this technical field, the detail is omitted here.

Figure 8A:
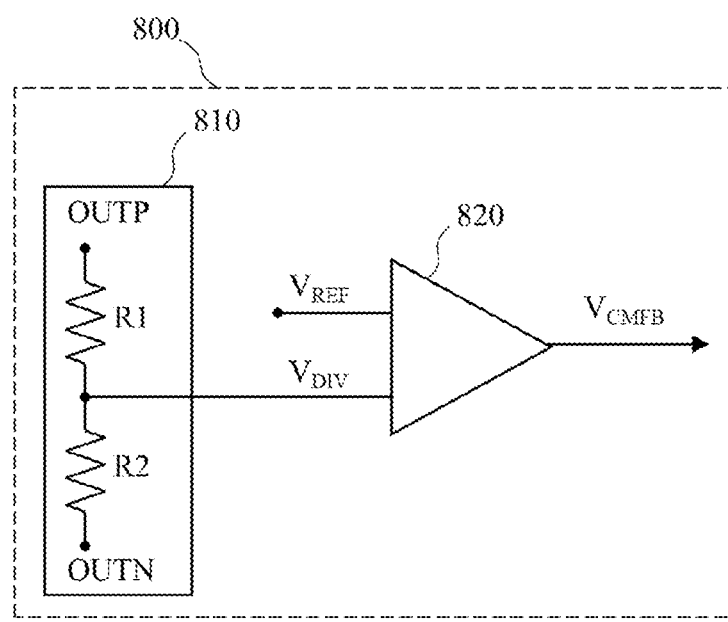
FIG. 8a shows an embodiment of the level-decision circuit of FIG. 1.

Please refer to FIG. 1. The level-decision circuit 150 and the load circuit 160 jointly determine the direct-current (DC) level of the differential output signal according to the differential output signal itself. FIG. 8a shows an embodiment of the level-decision circuit 150 including a common-mode feedback circuit 800. The common-mode feedback circuit 800 includes a voltage-dividing circuit 810 and an operational amplifier 820. The voltage-dividing circuit 810 includes two resistors (R1, R2) generating divisional voltage ($V_{DIV}$) according to the differential output signal; for instance, if the two resistors have the same resistance, the divisional voltage is equal to the average of the differential output signal $$\left(\text{i.e., } V_{DIV} = \frac{OUTP + OUTN}{2}\right).$$

Figure 8B:
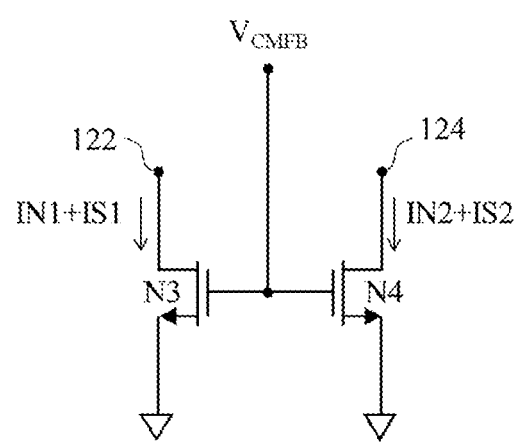
FIG. 8b shows an embodiment of the load circuit of FIG. 1.

The operational amplifier 820 outputs common-mode feedback voltage ($V_{CMFB}$) to the load circuit 160 according to the divisional voltage and reference voltage ($V_{REF}$). The load circuit 160 is coupled to the two output nodes 122, 124 and determines the DC level of the two output nodes 122, 124 according to the sum of the input current and the compensative current. FIG. 8b shows an embodiment of the load circuit 160 including an NMOS transistor pair (N3, N4). In an exemplary implementation, the variation of the common-mode feedback voltage correlates with the variation of the sum of the input current and the compensative current.

Figure 9:
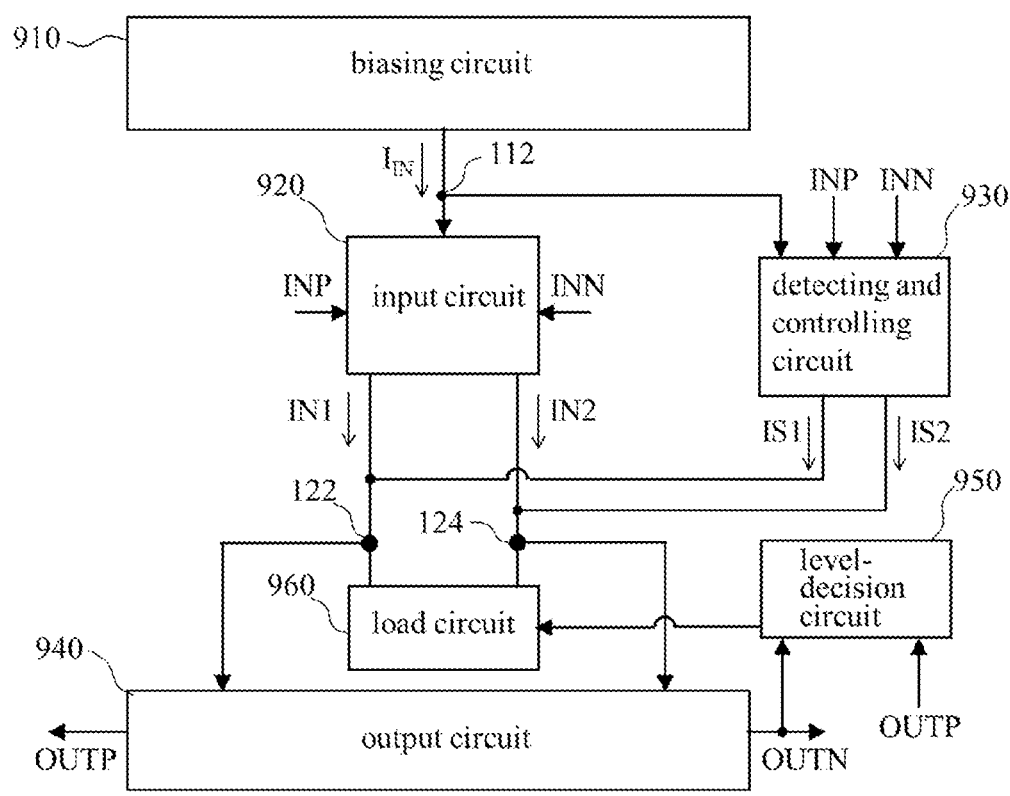
FIG. 9 shows another embodiment of the differential amplifier of the present disclosure.
Figure 10:
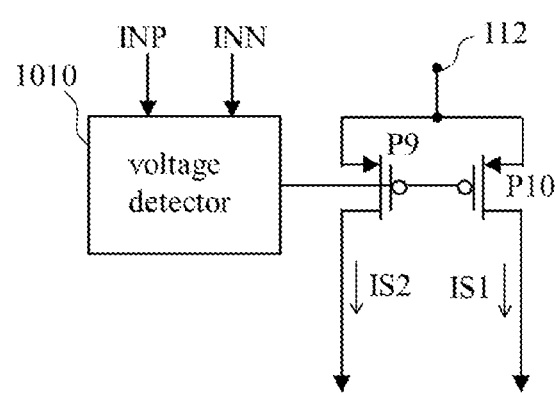
FIG. 10 shows an embodiment of the detecting and controlling circuit of FIG. 9.

FIG. 9 shows another embodiment of the differential amplifier of the present disclosure. The differential amplifier 900 of FIG. 9 includes a biasing circuit 910, an input circuit 920, a detecting and controlling circuit 930, an output circuit 940, a level-decision circuit 950, and a load circuit 960. The biasing circuit 910 is equivalent to the biasing circuit 110 of FIG. 1; the input circuit 920 is equivalent to the input circuit 120 of FIG. 1; the output circuit 940 is equivalent to the output circuit 140 of FIG. 1; the level-decision circuit 950 is equivalent to the level-decision circuit 150 of FIG. 1; and the load circuit 960 is equivalent to the load circuit 160 of FIG. 1. The detecting and controlling circuit 930 is configured to output the compensative current to the two output nodes 122, 124 according to the voltage of the differential input signal, wherein the compensative current is originated from the input bias current. In a circumstance the voltage of the differential input signal goes beyond the normal operable region of the input circuit 910, the input current outputted by the input circuit 920 gradually decreases or is fixed input current greater than zero while the detecting and controlling circuit 930 gradually increases the supply of the compensative current according to the variation of the voltage of the differential input signal or makes the compensative current be fixed compensative current greater than zero so as to prevent the insufficient input current from causing the differential amplifier 900 to malfunction. Compared with FIG. 1, the detecting and controlling circuit 930 of FIG. 9 has no need to refer to the aforementioned control bias voltage to generate the compensative current. FIG. 10 shows an embodiment of the detecting and controlling circuit 930 including a voltage detector 1010 and a PMOS transistor pair (P9, P10), wherein the voltage detector 1010 is configured to detect the differential input signal to generate gate voltage for the PMOS transistor pair and then the PMOS transistor pair outputs the compensative current according to the gate voltage. Since each of the voltage detector 1010 and the PMOS transistor pair is well known in this technical field, the detail is omitted here.

Since those of ordinary skill in the art can appreciate the detail and general modifications of FIGS. 9-10 by referring to the disclosure of FIGS. 1-8, which implies that some or all of the features of FIGS. 1-8 can be applied to FIGS. 9-10 in a reasonable way, therefore repeated and redundant description is omitted here. It should be noted that each reversed triangle symbol (∇) denotes a power supply terminal, a bias node, or a ground terminal, and it is determined according to the demand for implementation.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly. It should also be noted that although some embodiments of the present disclosure adopt PMOS transistors, this is not a limitation to the scope of the present invention; people of ordinary skill in the art can appreciate how to implement the present invention with NMOS transistors according to the present disclosure.

To sum up, the differential amplifier of the present disclosure is operable to supply the compensative current when the input current is insufficient or zero and thereby the differential amplifier can prevent itself from malfunctioning. In addition, the circuit of the differential amplifier is not complicated and thus the differential amplifier is good for implementation and cost-effective.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A differential amplifier, comprising:
   an input circuit configured to output input current to two output nodes according to voltage of a differential input signal and voltage of a bias node;
   a detecting and controlling circuit configured to output compensative current to the two output nodes according to control bias voltage and the voltage of the bias node, wherein the voltage of the bias node and the compensative current correlate with the voltage of the differential input signal; and
   an output circuit coupled to the two output nodes and configured to output a differential output signal according to a sum of the input current and the compensative current.

2. The differential amplifier of claim 1, further comprising:
   a level-decision circuit configured to generate control voltage according to the differential output signal; and
   a load circuit configured to determine a direct-current (DC) level of the differential output signal according to the control voltage.

3. The differential amplifier of claim 2, wherein in a circumstance the voltage of the differential input signal reaches a voltage threshold, the input current is proportional to the compensative current, or the input current and the compensative current are a minimum of the input current and a maximum of the compensative current respectively.

4. The differential amplifier of claim 1, wherein in a circumstance the voltage of the differential input signal reaches a voltage threshold, the input current is proportional to the voltage of the differential input signal or is a minimum of the input current while the compensative current is proportional to the voltage of the differential input signal or is a maximum of the compensative current.

5. The differential amplifier of claim 1, further comprising:
   a biasing circuit configured to supply input bias current to the input circuit and to the detecting and controlling circuit, wherein both the compensative current and the input current are originated from the input bias current.

6. The differential amplifier of claim 5, wherein the input bias current is equal to the sum of the input current and the compensative current.

7. The differential amplifier of claim 6, wherein in a circumstance the voltage of the differential input signal does not reach a voltage threshold, the input bias current is first current; in another circumstance the voltage of the differential input signal reaches the voltage threshold, the input bias current is second current; the first current is greater than or equal to the second current; and the second current is greater than zero.

8. The differential amplifier of claim 5, wherein the biasing circuit includes a current-mirror circuit configured to supply the input bias current according to reference current and a transistor scale, and gate voltage of the current-mirror circuit correlates with the control bias voltage.

9. The differential amplifier of claim 5, wherein both the input circuit and the detecting and controlling circuit receive the input bias current via the bias node, a conduction state of the input circuit depends upon the voltage of the differential input signal and the voltage of the bias node, and a conduction state of the detecting and controlling circuit depends upon the control bias voltage and the voltage of the bias node.

10. The differential amplifier of claim 1, wherein in a circumstance the voltage of the differential input signal does not reach a voltage threshold, the sum of the input current and the compensative current is first current; in another circumstance the voltage of the differential input signal reaches the voltage threshold, the sum of the input current and the compensative current is second current; the second current is not greater than the first current; and the second current is greater than zero.

11. The differential amplifier of claim 1, wherein the input circuit and the detecting and controlling circuit are connected in parallel, the input circuit includes two input transistors configured to output the input current according to the voltage of the differential input signal, and the detecting and controlling circuit includes two control transistors configured to output the compensative current according to the control bias voltage.

12. The differential amplifier of claim 1, wherein the control bias voltage is reference voltage.

13. A differential amplifier, comprising:
    a biasing circuit configured to supply input bias current to an input circuit and to a detecting and controlling circuit;
    the input circuit configured to output input current to two output nodes according to voltage of a differential input signal, wherein the input current is originated from the input bias current;
    the detecting and controlling circuit configured to output compensative current to the two output nodes according to the voltage of the differential input signal, wherein the compensative current is originated from the input bias current; and
    an output circuit coupled to the two output nodes and configured to output a differential output signal according to a sum of the input current and the compensative current.

14. The differential amplifier of claim 13, wherein the input bias current is equal to the sum of the input current and the compensative current.

15. The differential amplifier of claim 13, wherein in a circumstance the voltage of the differential input signal reaches a voltage threshold, the input current is proportional to the voltage of the differential input signal or is a minimum of the input current while the compensative current is proportional to the voltage of the differential input signal or is a maximum of the compensative current.

16. The differential amplifier of claim 15, wherein when the voltage of the differential input signal does not reach the voltage threshold, the sum of the input current and the compensative current is first current; when the voltage of the differential input signal exceeds the voltage threshold, the sum of the input current and the compensative current is second current; the second current is equal to or less than the first current; and the second current is greater than zero.

17. The differential amplifier of claim 13, further comprising:
    a level-decision circuit configured to determine a direct-current (DC) level of the differential output signal according to the differential output signal.

18. The differential amplifier of claim 17, wherein in a circumstance the voltage of the differential input signal reaches a voltage threshold, the input current is proportional to the compensative current, or the input current and the compensative current are a minimum of the input current and a maximum of the compensative current respectively.

19. The differential amplifier of claim 13, wherein the bias circuit includes a current-mirror circuit configured to supply the input bias current according to reference current and a transistor scale.

20. The differential amplifier of claim 13, wherein the input circuit and the detecting and controlling circuit are connected in parallel.

* * * * *